United States Patent [19]

Polczynski et al.

[11] Patent Number: 4,926,546
[45] Date of Patent: May 22, 1990

[54] PC BOARD PANEL CONFIGURATION TECHNIQUE

[75] Inventors: Mark Polczynski, Elm Grove; Brian Krueger, Brown Deer, both of Wis.

[73] Assignee: A. O. Smith Corporation, Milwaukee, Wis.

[21] Appl. No.: 204,707

[22] Filed: Jun. 9, 1988

[51] Int. Cl.$^5$ ............................................. H05K 3/35
[52] U.S. Cl. ..................................... 29/840; 29/412; 174/250
[58] Field of Search ................. 29/240, 832, 836, 840, 29/412, 413; 174/68.5; 361/409, 403; 927/97

[56] References Cited

U.S. PATENT DOCUMENTS

| | | | |
|---|---|---|---|
| 3,597,839 | 8/1971 | Jaccodine | 29/412 X |
| 4,216,523 | 8/1980 | Harford | 29/412 X |
| 4,343,084 | 8/1982 | Wilmarth | 29/412 X |
| 4,551,788 | 11/1985 | Daniel et al. | 174/68.5 X |

Primary Examiner—Carl J. Arbes
Attorney, Agent, or Firm—Niro, Scavone, Haller & Niro, Ltd.

[57] ABSTRACT

Disclosed an improved technique for configuring printed circuit board panels containing multiple printed circuit boards. In configuring these printed circuit board panels, the printed circuit board's electrically conductive patterns are symmetrically arranged about a center-line of the panel so that identical printed circuit board patterns are in the same location if the printed circuit board panel is rotated through a 180° angle about the center-line of this symmetry. This symmetry in the printed circuit board panel reduces by one-half the costs of tooling required to fabricate the printed circuit board and also allows components to be placed on both surfaces of the printed circuit board with a single set-up of an automated assembly line.

8 Claims, 1 Drawing Sheet

PC BOARD PANEL CONFIGURATION TECHNIQUE

BACKGROUND OF THE INVENTION

1. Field of the Invention

The present invention relates generally to the fabrication of printed circuit boards and, more particularly, to the configuration of printed circuit board panels adapted for use in the automated assembly of printed circuit boards.

2. Description of the Prior Art

Printed circuit boards have been used for fabricating electronic circuit assemblies for decades. Such printed circuit boards consist of at least a single layer of patterned electrical conductors secured to a sheet of electrically insulating material. Most commonly, the pattern of the electrical conductors is created by etching away regions from a continuous layer of electrically conductive material that was previously secured to the sheet of insulating material. Also, a plurality of apertures frequently pierce both the layer of electrically conductive material and the sheet of insulating material so leads of electrical components may pass through the printed circuit board. After electrical components have been positioned on the printed circuit board with their leads passing through the board, solder is applied to both the electrically conductive printed circuit board patterns and the electrical component leads to form electrically conductive paths therebetween.

Over the years, increasingly more complicated printed circuit boards have been fabricated. Accordingly, standard commercial manufacture now provides multilayer printed circuit boards that combine into a single assembly multiple layers of different printed circuit patterns. Assembling these multilayer printed circuit boards requires fabricating the individual printed circuit pattern for each conductor layer and sandwiching the various conductor layers together into a one piece assembly. In these multilayer printed circuit boards, the different layers of conductive patterns are separated from one another by sheets of insulating material.

In addition to the apertures that pierce the printed circuit board to receive the leads of electrical components, multilayer printed circuit boards include apertures which generally pierce the conductor layers and intervening sheets of insulating material to provide electrical connections between different layers of patterned conductors. After the required apertures have been formed both for these inter-layer electrical connections and also for electrical component leads, the walls of the apertures are usually plated with an electrically conductive material thus electrically interconnecting conductor patterns on different conductive layers.

While a large fraction of printed circuit boards are assembled using component whose leads pass through the printed circuit board, increasing use is being made of a component attaching technique in which the leads do not pass through the printed circuit board. In this alternative technique instead of passing through the printed circuit board, the electrical component leads attach directly to conductor patterns on the outer surface of the printed circuit board. This alternative technique, which is called surface mounting, provides two distinct advantages over the other technique in which the electrical component leads pass through the printed circuit board. First, surface mounted components are frequently attached to both surfaces of the printed circuit board. Components are not generally mounted on both surfaces of the printed circuit boards where component leads pass through a printed circuit board because sharp ends of component leads project outward from the surface of the printed circuit board opposite to that on which the components are located. Secondly, the electrical leads of surface mounted components need not be as strong, and therefore can be much smaller, since they are not inserted through apertures in the printed circuit board.

The ability to use finer electrical leads for electrical components is particularly advantageous for modern complex and/or high-speed integrated circuit components. Individual complex integrated circuit components may require as many as one-hundred or more individual leads. The small leads that may be used with surface mounted components permits packaging complex integrated circuits in a smaller area on printed circuit boards. As for high-speed integrated circuit components, their operation may be adversely affected if they are connected to an electrical circuit by leads of differing lengths. The ability to use finer leads for high-speed integrated circuit components allows minimizing the difference in length among them thereby reducing as much as possible any adverse effect on the circuit's performance.

All of the preceding improvements in electronic circuit fabrication that result from the use of multilayer printed circuit boards in conjunction with surface mounted electronic components have necessitated corresponding advances in the techniques used to fabricate, assemble, and test printed circuit boards. Consequently, the fabrication and testing of printed circuit boards, which decades ago was entirely performed by hand, is now a highly automated process. Thus digital computers are typically used in laying-out the electrically conductive patterns, in preparing the artwork that is frequently used to fabricate those conductive patterns or in fabricating those patterns directly, in mechanically forming apertures through various layers of the multilayer printed circuit board both for inter-layer electrical connections and to receive any leads of electrical components that pass through the printed circuit board, in testing the printed circuit board before any electronic components are attached to it, in controlling the operation of automated equipment used to place electrical components on the printed circuit board, and in testing the operation of the assembled printed circuit board.

Because automated equipment is widely used in fabricating and assembling multilayer printed circuit boards, particularly those employing surface mounted components, industry has generally adopted a standard size, rectangularly shaped printed circuit board panel measuring 24 by 18 inches along its edges. Thus, automated processing equipment, adapted for this standard size printed circuit board panel, is generally used to fabricate any desired printed circuit board design that fits on this standard panel size.

In using this standard size printed circuit board panel, after a printed circuit board has been designed and its conductor patterns laid-out, multiple copies of the printed circuit board's patterns may be arranged at different locations on the standard sized panel. Thus, the processing of a single printed circuit board panel frequently produces several individual printed circuit board assemblies concurrently.

After a printed circuit board design has been laid out, copies arranged at different locations on the standard panel, and the printed circuit board panels fabricated and tested, they are ready for electrical component attachment. Component attachment is usually performed on an automated, computer controlled assembly line. For surface mounted components, the first step in this automated assembly process is printing solder paste onto one surface of the printed circuit board panel.

Solder paste is printed onto one surface of a printed circuit board panel through a stencil so the paste will be applied to only those areas of the conductive patterns to which electrical component leads are to be attached. After the stencil is installed on the assembly line, solder paste is automatically applied to one surface of a printed circuit board panel.

After the solder paste is applied, epoxy adhesive may also be applied under computer control to selected locations on the printed circuit board's surface. This epoxy adhesive bonds the electronic components, particularly surface mounted components, to one surface of the printed circuit board panel as they are automatically placed on the board by a computer controlled apparatus included in the automated assembly line.

After all the components have been placed on one surface of a printed circuit board panel, the surface is heated so the solder on the electrically conductive patterns of the printed circuit board panel will reflow together with solder on the leads of the electronic components. Reflowing the solder between the conductive patterns of the printed circuit board panel and the electronic component leads electrically and mechanically interconnects the components with the printed circuit board's electronic circuit.

If, after electronic components have been attached to one surface of a printed circuit board panel additional electronic components are to be attached to the other surface, then the automated, computer controlled assembly line must be set-up to process the second surface of the printed circuit board panel. Setting-up the automated assembly line again requires shutting the line down for as long as one hour to install a different solder paste stencil and re-program the computer-controlled assembly line to attach components to the second side of the panel. After the solder paste stencil has been installed and the equipment has been re-programmed, the automated assembly line may again operate in the manner described above to apply solder paste, apply epoxy adhesive, place electronic components, and reflow the solder for the second surface of the printed circuit board panel.

After all the electronic components have been attached to both surfaces of the printed circuit board panel, it is washed to remove excess solder paste and flux residue, cut-up or severed (depaneled) to separate all the individual printed circuit boards included in the panel, and then the individual printed circuit boards are tested electrically for proper operation.

Despite the extensive use of digital computers, the complexity of present printed circuit board manufacturing requires the use of relatively expensive tooling for fabricating, assembling, and testing each different multilayer printed circuit board design, particularly multilayer printed circuit board assemblies using surface mounted components attached to both surfaces of the printed circuit board. For example, tooling-up to fabricate such a 4 layer printed circuit board panel may cost over $1,000. In addition, fixtures for testing such a printed circuit board panel may cost as much as $10,000.

Even though the manufacture of multilayer printed circuit board assemblies in the manner described above is complex and requires expensive tooling, due to the complexity of such electronic assemblies and the difficulties involved in fabricating them by any other technique, it is economically practical to fabricate as few as 25 printed circuit board assemblies in the manner described above. Because tooling-up to manufacture only 25 printed circuit board assemblies may cost over $5,000, the tooling cost alone for manufacturing such a small quantity approaches $200 per printed circuit board assembly. Consequently, the cost for fabricating small quantities of multilayer printed circuit boards having surface mounted components attached to both surfaces of the printed circuit board is extremely sensitive to tooling charges. Accordingly, anything that can be done to reduce the expense of tooling to fabricate such printed circuit board assemblies and/or to reduce non-productive set-up time for the automated assembly line greatly reduces the cost of fabricating small quantities of such printed circuit board assemblies.

Another problem encountered when attaching components to both sides of a printed circuit board is that considerable work-in-process can accumulate. To reduce set-up time, typically all printed circuit boards in a production lot will have components attached to one side of the board, and then the lot of boards will have components attached to the other side. Due to this sequence of operations, no units will be fully assembled until all of the units have been half assembled.

This not only leads to a large volume of work-in-process, but also means that every board in the lot will be half assembled before any board is fully assembled and available for electrical testing. Such a lag between full assembly and testing adversely affects the yield of the assembly process.

SUMMARY OF THE INVENTION

An object of the present invention is to provide an improved method of fabricating printed circuit board assemblies having lower tooling costs.

Another object of the present invention is to provide a more cost effective and more efficient way of fabricating printed circuit board assemblies, particularly in small quantities.

Another object of the present invention is to reduce the set-up, processing and construction time required for an automated assembly line used in fabricating printed circuit board assemblies having electronic components attached to both surfaces thereof.

Another object of the present invention is to reduce work-in-process and lag time between complete assembly and testing of a printed circuit board.

Briefly, the present invention includes an improved method for configuring printed circuit board panels containing multiple printed circuit boards. In configuring these printed circuit board panels, first the different electrically conductive patterns are laid-out for each layer of the printed circuit board. After the conductive patterns have been laid-out for all layers of the printed circuit board, these patterns are symmetrically arranged on the respective layers of the printed circuit board panel. In arranging the various printed circuit board conductive patterns on the printed circuit board panel in accordance with the present invention, copies are located symmetrically with respect to a center-line of the panel so that identical printed circuit boards patterns are in the same location if the printed circuit board panel is rotated through a 180° angle about the center-line of this symmetry.

By observing the preceding symmetry in assigning copies of the printed circuit board's conductive patterns to locations on the printed circuit board panel, performing all the operations required to completely fabricate printed circuit board assemblies involves only first processing one surface of the printed circuit board panel, then turning or rotating the panel over about the center-line of the printed circuit board configuration, and finally again performing the identical process a second time on the panel's second surface. Due to the configuration of the printed circuit board panel, performing the same processing operation twice in the preceding manner completely processes all the printed circuit boards of the printed circuit board panel. Thus, this symmetry in the printed circuit board panel reduces by one-half the tooling costs of previously known methods and also allows components to be placed on both surfaces of the printed circuit board with the same set-up of the automated assembly line.

Tooling costs are cut in half by the configuration technique of the present invention because one printed circuit board panel tool actually processes both surfaces of the individual printed circuit boards of the panel. Assembly costs are reduced and processing efficiency is increased by the configuration technique and method of the present invention because only a single set-up of the automated assembly line is required to process on both surfaces of the individual printed circuit boards making up the printed circuit board panel.

Furthermore, work-in-process and assembly-to-test time lags can be reduced dramatically since panels requiring bottom side assembly can be freely intermixed with panels requiring top side assembly. Thus, bottom side assembly can begin as soon as top side assembly has been completed.

Therefore, the method and technique of the present invention significantly reduces the fabrication cost for small quantities of printed circuit board assemblies having electronic components attached to both surfaces thereof. Moreover, the work-in-process and lag time between complete assembly and testing of printed circuit boards requiring electronic components attached to both sides of a board is greatly reduced.

These and other features, objects and advantages will be understood or apparent to those of ordinary skill in the art from the following detailed description of the preferred embodiment as illustrated in the various drawing figures.

DETAILED DESCRIPTION OF THE PREFERRED EMBODIMENT

Figure 1:
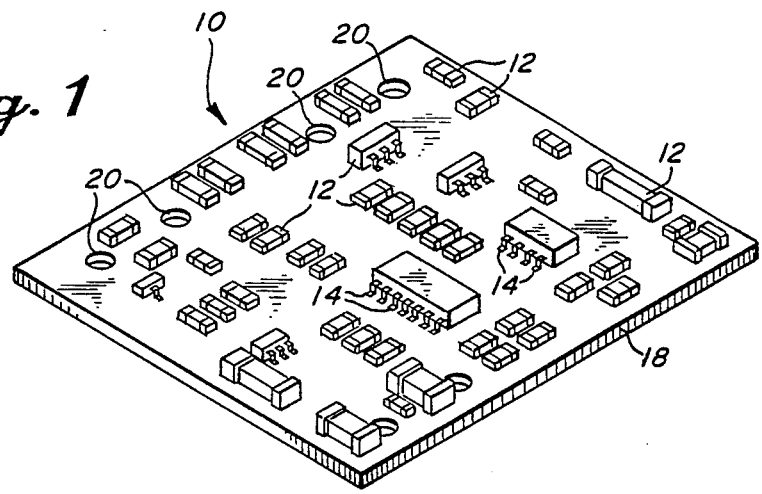
FIG. 1 is a perspective view depicting a printed circuit board assembly including surface mounted electronic components.
Figure 2:
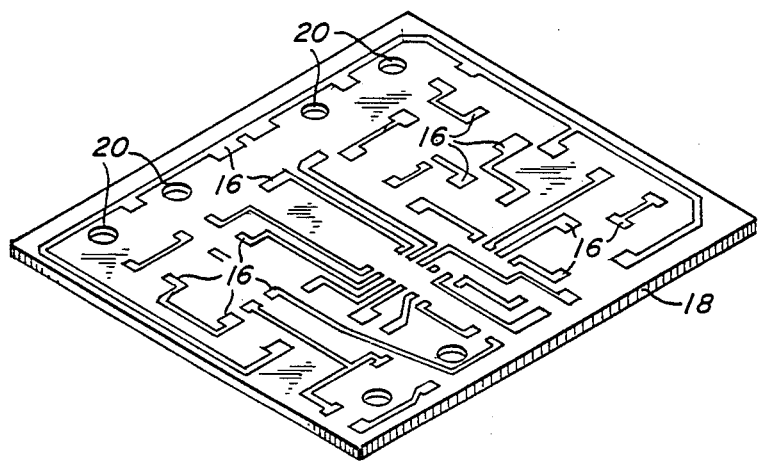
FIG. 2 is a perspective view depicting the printed circuit board of FIG. 1 without surface mounted electronic components.

FIG. 1 depicts a printed circuit board assembly referred to by the general reference character 10. Printed circuit board 10 includes a plurality of surface mounted electronic components 12. Electronic components 12 include leads 14 that are attached to electrically conductive patterns 16, depicted in FIG. 2, laid out on a printed circuit board 18. Printed circuit board 18 also includes a plurality of holes 20 which may be used for mechanically securing other electronic components thereto which are not illustrated in either FIGS. 1 or 2.

Figure 3:
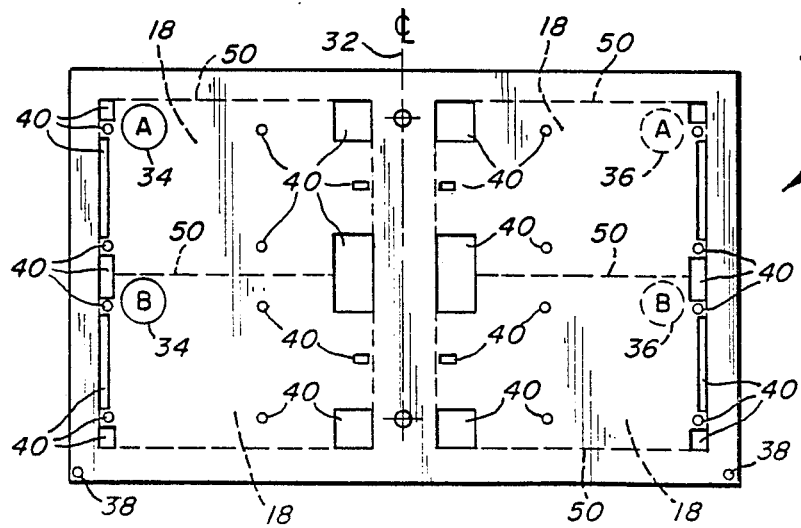
FIG. 3 is a plan view depicting a printed circuit board panel configured in accordance with the present invention as would be used in fabricating the printed circuit board of FIGURE 2.

FIG. 3 depicts a printed circuit board panel configured in accordance with the present invention and referred to by the general reference character 30. Symmetrically arranged about a center-line 32 of printed circuit board panel 30 are four patterns for printed circuit boards 18A, 18B, 18C and 18D. Encircled capital letters "A" and "B," which identify one particular surface of printed circuit boards 18A and 18B, respectively, are also arranged symmetrically with respect to center-line 32. On the left of FIG. 3, encircling of capital letters "A" and "B" with solid lines 34 indicates that the particular surface of printed circuit boards 18A and 18B, respectively, identified by these letters faces upward out of FIG. 3. On the right of FIG. 3, encircling of capital letters "A" and "B" with broken lines 36 indicates that the same surface of the printed circuit boards 18C and 18D, respectively, identified by these letters faces downward into FIG. 3.

Also located symmetrically with respect to center-line 32 are tooling holes 38 that are adapted to engage mating structures incorporated into various processing and handling equipment which is not illustrated. Thus tooling holes 38 in conjunction with such mating structures determine the placement of printed circuit board panel 30 on the various processing and handling equipment. Also depicted in FIG. 3 are various other holes 40 through printed circuit board panel 30 that are significant only to the particular printed circuit board pattern illustrated and which may be used for mounting of other components. Consequently, details regarding holes 40 are not necessary to the explanation and understanding of the present invention.

As set forth above, tooling costs for fabricating printed circuit board panels 30 in accordance with the present invention are reduced by one-half. This significant cost reduction occurs since only one set of tooling and a single board test fixture, rather than two, are required to fabricate and test panels 30 due to its mirror image structure and rotational capacity.

With a printed circuit board panel 30 in accordance with the present invention, as depicted in FIG. 3, it is apparent that all electronic components 12 to be attached to that surface of printed circuit boards 18A and 18B, respectively, identified by the capital letters "A" and "B" encircled with solid line 34, can be placed thereon by processing that half of panel 30 depicted to the left of center-line 32. Conversely, all electronic components 12 to be attached to the surface of printed circuit boards 18C and 18D, respectively, identified by the capital letters "A" and "B" encircled by broken lines 36, can be placed thereon by processing that half of printed circuit boards panel 30 depicted to the right of center-line 32.

Accordingly, in fabricating printed circuit board assemblies 10 in accordance with the present invention, surface mounted electronic components 12 are attached during a single processing operation, consisting of printing and drying solder paste, applying epoxy adhesive, placing electronic components 12 and reflowing solder, over the entire first surface of printed circuit board panel 30. Thus, electronic components 12 are attached to one surface of those printed circuit boards 18A and 18B in panel 30 located to the left of center-line 32 while electronic components 12 are attached to the opposite surface of those printed circuit boards 18C and 18D in panel 30 located to the right of center-line 32.

After electronic components 12 have been thus attached to one surface of printed circuit board panel 30, panel 30 is rotated 180° about center-line 32 analogous to turning the pages in a book. This rotation of printed circuit board panel 30 causes the capital letters "A" to exchange locations and the capital letters "B" to also exchange locations. This exchange of locations by the capital letters "A" and "B" provides that identical patterns on the surface of printed circuit boards 18A and 18B, respectively, are in the same locations as the surface of printed circuit boards 18C and 18D, respectively, both before and after the printed circuit board panel 30 is rotated. This feature of the present invention provides each printed circuit board panel 30 with an even number of printed circuit boards 18, one-half of the total number located to one side of centerline 32 and the other half located on the opposite side of centerline 32.

Having thus rotated printed circuit board panel 30 in accordance with the present invention, electronic components 12 are now attached over the second surface of printed circuit board panel 30 in identically the same manner as they were attached to the first surface of panel 30. Therefore, attachment of electronic components 12 to the second surface of printed circuit board panel 30 requires no change in the set-up of an automated assembly line from that which attached electronic components 12 to the first surface of printed circuit board panel 30.

Attachment of electronic components 12 to the second surface of printed circuit board panel 30 completes assembly of all electronic components 12 to both surfaces of all printed circuit boards 18A, 18B, 18C and 18D of printed circuit board panel 30. After both surfaces of printed circuit board panel 30 have been thus processed, fabrication of printed circuit board assemblies 10 is completed by washing panel 30 and then depaneling or severing it into individual printed circuit board assemblies 10 by cutting the panel 30 along broken lines 50 depicted in FIG. 3.

Although the present invention has been described in terms of the presently preferred embodiment, it is to be understood that such disclosure is purely illustrative and is not to be interpreted as limiting. Consequently, without departing from the spirit and scope of the invention, various alterations, modifications, and/or alternative applications of the invention will, no doubt, be suggested to those skilled in the art after having read the preceding disclosure. Accordingly, it is intended that the following claims be interpreted as encompassing all alterations, modifications, or alternative applications as fall within the true spirit and scope of the invention.

What is claimed is:

1. A method for configuring a printed circuit board panel adapted for the concurrent fabrication of a plurality of printed circuit boards, said method comprising the steps of:
    laying-out patterns for each individual layer of the printed circuit boards; and
    symmetrically arranging, for fabrication on the printed circuit board panel with respect to a center-line thereof, copies of individual ones of the patterns positioned so that identical printed circuit board patterns are in the same location if the printed circuit board panel is rotated through a 180° angle about said center-line.

2. A method for fabricating a printed circuit board panel adapted for the concurrent fabrication of a plurality of printed circuit boards, said method comprising the steps of:
    laying-out conductive patterns for each individual layer of the printed circuit boards;
    symmetrically arranging, for fabrication on the printed circuit board panel with respect to a center-line thereof, copies of individual ones of the patterns positioned so that identical printed circuit board patterns are in the same location if the printed circuit board panel is rotated through a 180° angle about said center-line;
    fabricating the printed circuit board panel having symmetrically arranged copies of the printed circuit board patterns;
    attaching electronic components to a first surface of the printed circuit board panel;
    rotating the printed circuit board panel 180° about said center-line; and
    attaching electronic components to a second surface of the printed circuit board panel.

3. The method of claim 2 wherein the step of attaching electronic components to the printed circuit board panel comprises the steps of:
    printing solder paste onto the printed circuit board panel;
    placing electronic components onto the printed circuit board panel; and
    heating the surface of the printed circuit board panel to reflow solder between the conductive patterns thereon and leads of the electronic components.

4. The method of claim 3 further comprising the step of applying epoxy adhesive to the printed circuit board panel prior to placing electronic components thereon.

5. The method of claim 2 further comprising the step of washing the printed circuit board panel after electronic components have been attached thereto.

6. The method of claim 2 further comprising the step of depaneling the printed circuit board panel after electronic components have been attached thereto for separating it into the individual printed circuit boards.

7. A printed circuit board panel for the concurrent fabrication of a plurality of printed circuit board assemblies comprising:
    a plurality of printed circuit board patterns symmetrically arranged with respect to a center-line of said printed circuit board panel so that identical printed circuit boards are in the same location if said printed circuit board panel is rotated 180° about said center-line.

8. The printed circuit board panel of claim 7 further comprising electronic components attached to said printed circuit board panel.

* * * * *